United States Patent [19]
Wolf

[11] Patent Number: 5,821,819
[45] Date of Patent: Oct. 13, 1998

[54] BASE STATION OSCILLATOR TUNED WITH RECEIVED CLOCK SIGNAL

[75] Inventor: Michael Wolf, Mundelsheim, Germany

[73] Assignee: Alcatel Alsthom Compagnie Generale d'Electricite, Paris, France

[21] Appl. No.: 917,950

[22] Filed: Aug. 27, 1997

[30] Foreign Application Priority Data

Aug. 28, 1996 [DE] Germany .................. 196 34 740.8

[51] Int. Cl.$^6$ .................................................. H03L 7/085
[52] U.S. Cl. .............................. 331/17; 331/25; 375/376
[58] Field of Search .................. 331/17, 25; 375/376

[56] References Cited

U.S. PATENT DOCUMENTS

| | | | |
|---|---|---|---|
| 4,847,569 | 7/1989 | Dudziak et al. | 331/25 |
| 5,028,885 | 7/1991 | Voigt et al. | 331/17 |
| 5,113,416 | 5/1992 | Lindell | 375/97 |
| 5,392,005 | 2/1995 | Bortolini et al. | 331/44 |
| 5,473,284 | 12/1995 | Jäntti et al. | 331/10 |

FOREIGN PATENT DOCUMENTS

| | | |
|---|---|---|
| 3912814 | 7/1990 | Germany . |
| 4342248 | 6/1994 | Germany . |

OTHER PUBLICATIONS

ITU–T Recommendation G.70X (Draft); "General Aspects of Digital Transmission Systems: Network Node Interface for the Synchronous Digital Hierarchy (SDH)", Mar. 1995, pp. 55–56.

ITU–T Recommendation G.704, Study Group 15, Contribution 108, Oct. 1994, pp. 17–18.

ITU–T Recommendation G.8111, Digital Networks: Timing Requirements at the Outputs of Primary Reference Clocks Suitable for Plesio–chronous Operation of International Digital Links, 1988; 1993. pp. 1–6.

"Compact Ovenized Crystal Oscillators with Internal Synchronization to Standard Frequency Transmitters", B. Neubig et al, *15th Piezo–electric Devices Conf. and Exhibition*, Washington DC, Sep. 21–23, 1993, pp. 20–23.

*Primary Examiner*—Siegfried H. Grimm
*Attorney, Agent, or Firm*—Ware, Fressola, Van Der Sluys & Adolphson LLP

[57] ABSTRACT

To generate a carrier frequency, a base station needs an oscillator with a long-term stability better than $5 \cdot 10^{-8}$. In the case of crystal oscillators it is therefore necessary to regularly adjust the frequency so as to compensate for frequency drift due to aging. The oscillator (OSC) of a base station (BTS) is automatically tuned with the pulse repetition frequency of the clock (CLK) of a digital communication signal (STM). To prevent variations in the pulse repetition frequency of the clock (CLK) from affecting the stability of the carrier frequency (CAR), the oscillator (OSC) is only tuned during times that a quality indicator contained in the digital communication signal (STM) guarantees a high frequency accuracy of $10^{-11}$.

9 Claims, 2 Drawing Sheets

BASE STATION OSCILLATOR TUNED WITH RECEIVED CLOCK SIGNAL

BACKGROUND OF THE INVENTION

1. Technical Field

This invention relates to a base station with a tunable oscillator and to a method of tuning a tunable oscillator.

2. Discussion of Related Art

In base stations for mobile radio networks based on, for example, the GSM standard, high-stability oscillators are needed to generate a carrier frequency. The relative frequency error of such oscillators must be less than $5 \cdot 10^{-8}$ in order to meet the GSM standard (GSM 11.21). Currently used crystal oscillators are low in cost but meet these requirements only insufficiently since they exhibit frequency drift due to aging. Such crystal oscillators must therefore be tuned at regular intervals, with manual tuning being very expensive because the base station sites are widely scattered.

In an article by B. Neubig et al, "Compact Ovenized Crystal Oscillators with Internal Synchronization to Standard Frequency Transmitters", 15th Piezoelectric Devices Conference and Exhibition, Washington, D.C., USA, Sep. 21 to 23, 1993, pages 20–23, a crystal oscillator for use in base stations is described which, in order to compensate for frequency drift due to aging, is synchronized by a circuit for adjusting the oscillator to the standard frequency transmission by the transmitter DCF-77. The long-term frequency stability in the solution presented is $10^{-9}$. However, the solution is very expensive, since the circuit for adjusting the oscillator requires, besides a receiver with an external antenna, an analog filter circuit, an auxiliary oscillator, and a microprocessor. In addition, the solution is susceptible to persistent disturbances of the DCF-77 carrier.

U.S. Pat. No. 5,392,005 discloses a circuit arrangement with a crystal oscillator which compares the frequency of the oscillator with an external reference frequency and, if the oscillator frequency deviates from the reference frequency, adjusts the oscillator with a correction signal calculated from the difference between the oscillator frequency and the reference frequency. The patent specification also mentions a detector for monitoring the stability of the external reference frequency but gives no information on the design of this detector. Furthermore, the specification states that the circuit arrangement is used in a telecommunication switching system and that the external reference frequency is derived from a telecommunication network to which the telecommunication switching system is connected.

SUMMARY OF THE INVENTION

An object of the invention is to provide a base station comprising a tunable oscillator wherein high long-term stability of the oscillator as specified by the GSM standard is achieved with a small amount of technical complexity. Another object of the invention is to provide a method of tuning a tunable oscillator in a base station whereby a frequency drift of the oscillator is compensated for without any disturbances of an external reference frequency affecting the frequency accuracy of the oscillator.

According to a first aspect of the present invention, a base station with a tunable oscillator for generating a carrier frequency and with an arrangement for tuning the oscillator, is characterized in that the arrangement for tuning the oscillator comprises a clock recovery unit for deriving a clock signal having a pulse repetition frequency from a digital communication signal; a frequency comparator for generating a correction signal dependent on a difference between a frequency of the oscillator and a pulse repetition frequency of the clock signal, said correction signal serving to tune the oscillator; and a control facility for tuning the oscillator with the correction signal in accordance with a quality indicator which indicates stability of the clock signal and forms part of the digital communication signal.

According to a second aspect of the present invention, a method of tuning a tunable oscillator for generating a carrier frequency of a base station comprises the steps of deriving a clock signal having a pulse repetition frequency from a digital communication signal; generating a correction signal dependent on a difference between a frequency of the tunable oscillator and the pulse repetition frequency of the clock signal; and tuning the oscillator with the correction signal in accordance with a quality indicator which indicates stability of the clock signal and forms part of the digital communication signal.

One advantage of the invention is that a low-cost oscillator can be used in a base station, since frequent tuning eliminates the need for long-term stability of the oscillator. Nevertheless, with the invention, a higher long-term stability of the oscillator is achieved than with hitherto used free-running oscillators, since the oscillator is tuned with a highly accurate ($10^{-11}$) reference frequency.

These and other objects, features and advantages of the present invention will become more apparent in light of the detailed description of a best mode embodiment thereof, as illustrated in the accompanying drawing.

DETAILED DESCRIPTION OF PREFERRED EMBODIMENT

A basic idea of the invention is to tune an oscillator in a radio base station using an external reference frequency which is available in the base station. Such an external reference frequency is the pulse repetition frequency of a digital communication signal which is received by the base station from a digital communications network to which the base station is connected. However, the pulse repetition frequency exhibits frequency variations if synchronization errors occur in the digital communications network.

To prevent synchronization errors in the digital communications network from affecting the frequency accuracy of the oscillator, a quality indicator contained in the digital communication signal and indicating the accuracy of the pulse repetition frequency is read, and the oscillator is only tuned during times that the quality indicator guarantees a high accuracy of the pulse repetition frequency. Such a quality indicator is defined in ITU-T Recommendation G.70X for digital communication signals of the synchronous digital hierarchy (SDH) and in ITU-T Recommendation G.704 for digital communication signals of the plesiochronous digital hierarchy (PDH). According to ITU-T Recommendation G.811, the high accuracy of the pulse repetition frequency which the quality indicator can guarantee is $10^{-11}$, i.e., the relative frequency error is less than or equal to $10^{-11}$.

Figure 1:
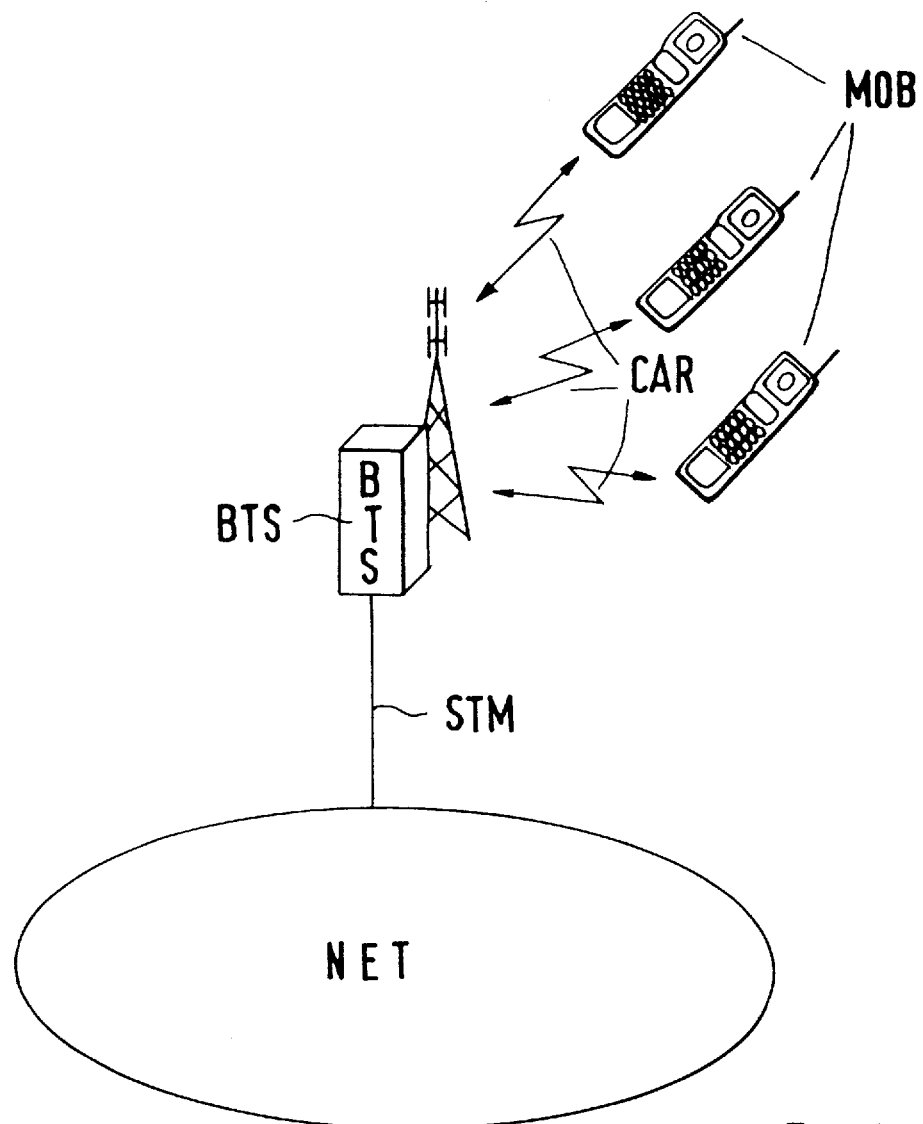
FIG. 1 shows a base station which is connected to a communications network and is in radio communication with mobile telephones.

FIG. 1 shows a base station BTS connected to a digital communications network NET which may be based on either the SDH (synchronous digital hierarchy) concept or the PDH (plesiochronous digital hierarchy) concept. From the digital communications network NET, the base station BTS receives a digital communication signal STM. Also shown, by way of example, are three mobile telephones MOB which are in radio communication with the base station BTS. For the radio transmission between base station BTS and mobile telephone MOB, use is made of a carrier frequency CAR.

To generate the carrier frequency CAR, the base station BTS includes an oscillator which must have a relative frequency accuracy better than $5 \cdot 10^{-8}$ in order to meet the GSM standard 11.21. To be able to compensate for slow frequency drifts of the oscillator, such as frequency drifts due to aging, the base station additionally includes an arrangement for tuning the oscillator.

Figure 2:
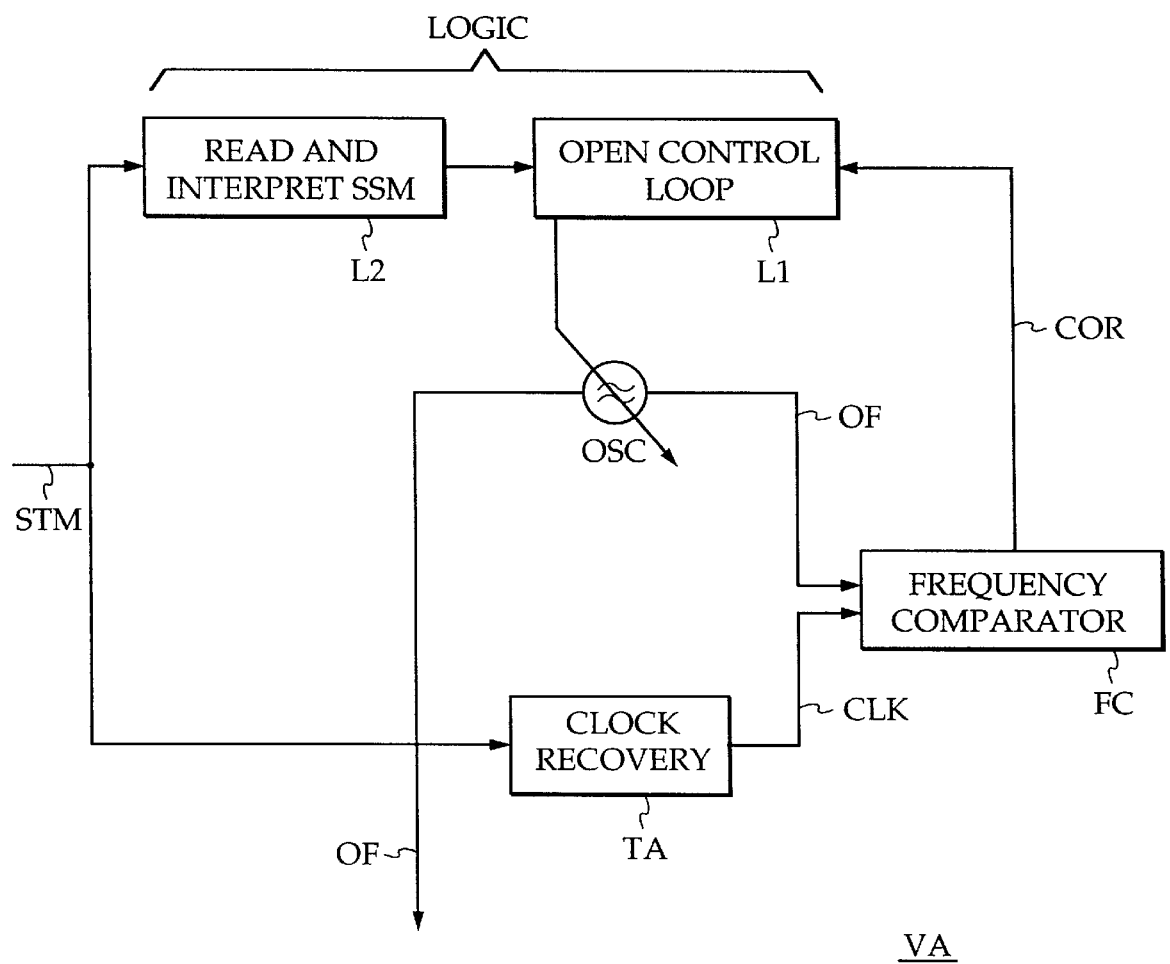
FIG. 2 is a block diagram of an arrangement for tuning a tunable oscillator.

FIG. 2 shows an embodiment of an arrangement VA for tuning the oscillator in a block diagram. It consists of a clock recovery unit TA, a frequency comparator FC, a control facility LOGIC, and the tunable oscillator OSC. The clock recovery unit TA has an input, to which the digital communication signal STM is applied, and an output, which provides a clock signal CLK derived from the digital communication signal STM. The clock signal CLK has a pulse repetition frequency which serves as an external reference frequency for adjusting the oscillator OSC.

The frequency comparator FC has two inputs. One of them is connected to the output of the clock recovery unit TA, and the other to a frequency output of the oscillator OSC. The inputs of the frequency comparator FC thus receive the frequency signals CLK and OF from the clock recovery unit TA and the oscillator OSC, respectively. The frequency comparator FC compares the two frequency signals CLK, OF and generates a correction signal COR which is dependent on a difference between the frequency OF of the oscillator OSC and the pulse repetition frequency CLK. This correction signal COR appears at an output of the frequency comparator FC.

The arrangement VA for tuning the oscillator OSC may further include a divider which divides the reference frequency CLK or the frequency OF of the oscillator. This may be necessary in order to nominally adapt the two frequencies OF, CLK to one another. The clock CLK of the digital communication signal STM may be, for example, the 2-MHz clock of an STM-1 signal of the synchronous digital hierarchy. If a 10-MHz oscillator is to be tuned with this signal, the frequency OF of the oscillator OSC will be divided by 5 in a divider and then be compared with the reference frequency CLK. If the nominally equal frequencies OF and CLK differ, the oscillator OSC must be tuned as soon as the quality indicator indicates a frequency accuracy higher than the frequency accuracy required for the oscillator.

The output of the frequency comparator FC is coupled to the control facility LOGIC. The control facility LOGIC has an input to which the digital communication signal STM is applied. The function of the control facility LOGIC is to read a quality indicator contained in the digital communication signal and to tune the oscillator OSC with the correction signal COR in accordance with the quality indicator.

The quality indicator is preferably a predetermined bit or a predetermined bit sequence in the frame of the received digital communication signal. The communication signal is preferably a pulse-code-modulated signal, such as a PCM-30 signal, which is received from a mobile switching center (MSC) to which the base station is connected via the communications network.

The digital communication signal STM may be a signal of the synchronous digital hierarchy (SDH) or a signal of the plesiochronous digital hierarchy (PDH). In both cases, the communication signal STM has frames in which the quality indicator is contained. The quality indicator indicates the synchronization quality of the network element from which the radio station receives the communication signal STM, and thus the frequency accuracy of the clock signal CLK. In a communication signal of the synchronous digital hierarchy (SDH), the quality indicator consists of bits 5 to 8 of the S1 byte contained in the so-called section overhead (SOH) of the frames of the communication signal. In communication signals of the plesiochronous digital hierarchy (PDH), the quality indicator is one of bits $S_{a4}$ to $S_{a8}$ contained in the superframe structure of the communication signal STM (ITU-T G.704).

If the quality indicator consists of the bit sequence 0010, maximum frequency accuracy is guaranteed for the clock of the digital communication signal. According to ITU-T Recommendation G.811, this means a maximum relative frequency deviation of $10^{-11}$. Therefore, the control facility LOGIC tunes the oscillator OSC with the correction signal COR during times that the quality indicator consists of the bit sequence 0010.

If synchronization errors occur in the digital communications network NET, e.g., due to a failure of a transmission link or a network element, these errors must not affect the accuracy of the carrier frequency of the base station. This is achieved by not tuning the oscillator OSC with the correction signal COR, particularly during times that the quality indicator consists of the bit sequence 0000, 1111, or 1011. The bit sequences 1111 and 0000 indicate that the synchronization quality is unknown, and the bit sequence 1011 indicates that the clock generator of the sending network element is not synchronized. The bit sequences 0010 and 1000 indicate a less high frequency accuracy of the clock, and all other possible bit sequences are not fixed in the standards. Therefore, the oscillator OSC is preferably tuned only during the times that the quality indicator contains the bit sequence 0010.

In the embodiment shown, the control facility LOGIC consists of a first unit L1, which routes the correction signal COR from the frequency comparator FC to the oscillator OSC and closes or opens the control loop between oscillator OSC, frequency comparator FC, and control facility LOGIC, and a second unit L2, which reads the quality indicator and switches the first unit L1.

The oscillator OSC in the embodiment shown has two frequency outputs. One of them is connected to one input of the frequency comparator FC, and the other provides the frequency signal OF for generating the carrier frequency. The oscillator may be an oven-controlled crystal oscillator (OCXO) or a digitally temperature-compensated crystal oscillator (DTCXO). It is also possible to use simple crystal oscillators without temperature control or compensation, since temperature-induced frequency drifts of the oscillator are also compensated for by frequent tuning with the pulse repetition frequency from the digital communications network.

Tuning of the crystal oscillator can also be effected by means of load capacitances connected in series with the crystal oscillator. The load capacitances may be varactor diodes or combinations of varactor diodes and capacitors. The capacitance of the varactor diodes can then be adjusted by applying a correction voltage. In that case, the correction signal COR provided by the frequency comparator FC will be a correction voltage which is applied via the control facility LOGIC to the varactor diodes of the oscillator OSC for tuning the latter.

In a preferred embodiment of the invention, the frequency comparator FC includes a low-pass filter which suppresses the phase and frequency variations of the clock CLK with a time constant of up to several hours, so that short-time frequency variations of the clock CLK will not affect the carrier frequency CAR of the base station BTS via the tuning of the oscillator OSC.

Although the invention has been shown and described with respect to a best mode embodiment thereof, it should be understood by those skilled in the art that the foregoing and various other changes, omissions and additions in the form and detail thereof may be made therein without departing from the spirit and scope of the invention.

I claim:

1. A base station (BTS) with a tunable oscillator (OSC) for generating a carrier frequency (CAR) and with an arrangement (VA) for tuning the oscillator (OSC), characterized in that the arrangement (VA) for tuning the oscillator (OSC) comprises:

a clock recovery unit (TA) for deriving a clock signal (CLK) having a pulse repetition frequency from a digital communication signal (STM);

a frequency comparator (FC) for generating a correction signal (COR) dependent on a difference between a frequency (OF) of the oscillator (OSC) and a pulse repetition frequency of the clock signal (CLK), said correction signal (COR) serving to tune the oscillator (OSC); and a control facility (LOGIC) for tuning the oscillator (OSC) with the correction signal (COR) in accordance with a quality indicator which indicates stability of the clock signal and forms part of the digital communication signal (STM).

2. A base station (BTS) as claimed in claim 1, characterized in that the control facility (LOGIC) is provided for evaluating the quality indicator, which is contained in a frame of the digital communication signal.

3. A base station (BTS) as claimed in claim 1, characterized in that the digital communication signal is a pulse-code-modulated (PCM) signal which is received by a mobile switching center from a communications network.

4. A base station (BTS) as claimed in claim 1, characterized in that the digital communication signal (STM) is of a synchronous digital hierarchy, that as the quality indicator, the control facility (LOGIC) uses bits 5 to 8 of an S1 byte, which is contained in a section overhead (SOH) part of the frame of the digital communication signal (STM), and that the oscillator (OSC) is tunable only when the quality indicator consists of a bit sequence 0010.

5. A base station as claimed in claim 1, characterized in that the digital communication signal (STM) is of a plesiochronous digital hierarchy, that as the quality indicator, the control facility (LOGIC) uses one of bits $S_{a4}$ to $S_{a8}$ in a superframe structure of the digital communication signal (STM), and that the oscillator (OSC) is tunable only when the quality indicator consists of a bit sequence 0010.

6. A base station as claimed in claim 1, characterized in that the clock recovery unit (TA) includes a low-pass filter which suppresses phase and frequency variations of the clock signal (CLK) in the digital communication signal (STM) with a time constant of up to several hours.

7. A method of tuning a tunable oscillator (OSC) for generating a carrier frequency (CAR) of a base station (BTS), comprising the steps of:

deriving a clock signal (CLK) having a pulse repetition frequency from a digital communication signal (STM);

generating a correction signal (COR) dependent on a difference between a frequency (OF) of the tunable oscillator (OSC) and the pulse repetition frequency of the clock signal (CLK); and tuning the oscillator (OSC) with the correction signal (COR) in accordance with a quality indicator which indicates stability of the clock signal and forms part of the digital communication signal (STM).

8. A method as claimed in claim 7, characterized in that the digital communication signal (STM) is a communication signal of a synchronous digital hierarchy, that the quality indicator is composed of bits 5 to 8 of an S1 byte, which is contained in a section overhead (SOH) part of a frame of the communication signal (STM), and that the step of tuning the oscillator (OSC) takes place only during times that the quality indicator consists of a bit sequence 0010.

9. A method as claimed in claim 7, characterized in that the digital communication signal (STM) is a communication signal of a plesiochronous digital hierarchy, that the quality indicator uses one of a plurality of bits $S_{a4}$ to $S_{a8}$ in a superframe structure of the communication signal (STM), and that the step of tuning of oscillator (OSC) takes place only during times that the quality indicator consists of a bit sequence 0010.

* * * * *

UNITED STATES PATENT AND TRADEMARK OFFICE
CERTIFICATE OF CORRECTION

PATENT NO. : 5,821,819
DATED : October 13, 1998
INVENTOR(S) : M. Wolf

It is certified that error appears in the above-identified patent and that said Letters Patent is hereby corrected as shown below:

On the title page:
At INID [56], prior to line 3, please insert
--4,592,071  7/1986  Prigent  375/42--;

after line 7, please insert
--5,604,768  2/1997  Fulton  375/220--;

prior to line 9, please insert
--0123587  10/1984  European Pat. Off.--; and after line 10, please insert
--9619875  6/1996  WIPO--.

Signed and Sealed this

Twenty-third Day of February, 1999

Attest:

Attesting Officer

Q. TODD DICKINSON

Acting Commissioner of Patents and Trademarks